United States Patent
Choi

(10) Patent No.: US 7,032,084 B2
(45) Date of Patent: Apr. 18, 2006

(54) CIRCUIT FOR GENERATING COLUMN SELECTION CONTROL SIGNAL IN MEMORY DEVICE

(75) Inventor: Jung Kyun Choi, Seoul (KR)

(73) Assignee: Hynix Semiconductor, Inc., Kyungki-Do (KR)

(*) Notice: Subject to any disclaimer, the term of this patent is extended or adjusted under 35 U.S.C. 154(b) by 260 days.

(21) Appl. No.: 10/331,272

(22) Filed: Dec. 30, 2002

(65) Prior Publication Data

US 2004/0015663 A1    Jan. 22, 2004

(30) Foreign Application Priority Data

Jul. 16, 2002   (KR)   ................  10-2002-0041658

(51) Int. Cl.
  *G06F 12/00*  (2006.01)
(52) U.S. Cl. ................. 711/154; 711/104; 711/105; 365/203; 365/230.06
(58) Field of Classification Search ................ 711/154, 711/104, 105; 714/711; 365/230.06, 233, 365/203
See application file for complete search history.

(56) References Cited

U.S. PATENT DOCUMENTS

| | | | |
|---|---|---|---|
| 4,291,392 A * | 9/1981 | Proebsting ................. | 365/203 |
| 4,802,135 A | 1/1989 | Shinoda et al. ............. | 365/233 |
| 5,305,283 A * | 4/1994 | Shimokura et al. .... | 365/230.08 |
| 5,414,672 A * | 5/1995 | Ozeki et al. ............. | 365/233.5 |
| 5,475,633 A | 12/1995 | Mehalel ...................... | 365/154 |
| 5,694,370 A * | 12/1997 | Yoon ....................... | 365/233.5 |
| 5,748,560 A * | 5/1998 | Sawada ...................... | 365/233 |
| 5,802,594 A | 9/1998 | Wong et al. ................ | 711/167 |
| 5,859,799 A * | 1/1999 | Matsumoto et al. ... | 365/189.09 |
| 6,061,295 A * | 5/2000 | Roh ........................... | 365/233 |
| 6,061,297 A * | 5/2000 | Suzuki ................... | 365/238.5 |
| 6,320,816 B1 * | 11/2001 | Seyyedy et al. ........ | 365/230.06 |
| 6,711,648 B1 * | 3/2004 | Poechmueller et al. ..... | 711/105 |

* cited by examiner

Primary Examiner—Pierre Bataille
Assistant Examiner—Sheng-Jen Tsai
(74) Attorney, Agent, or Firm—Marshall, Gerstein & Borun LLP

(57) ABSTRACT

A circuit for generating a Yi control signal in a memory device. The circuit comprises a column select signal control block for generating a Yi control signal for a normal operation of a first cycle of a page mode, a latch for setting the Yi control signal from the column select signal control block, a read reset block for resetting the latch, a page read Yi enable block for generating the Yi control signal when a page address is changed in a page read mode and then setting the latch, and a page read reset block for resetting the latch set by the page read Yi enable block.

15 Claims, 7 Drawing Sheets

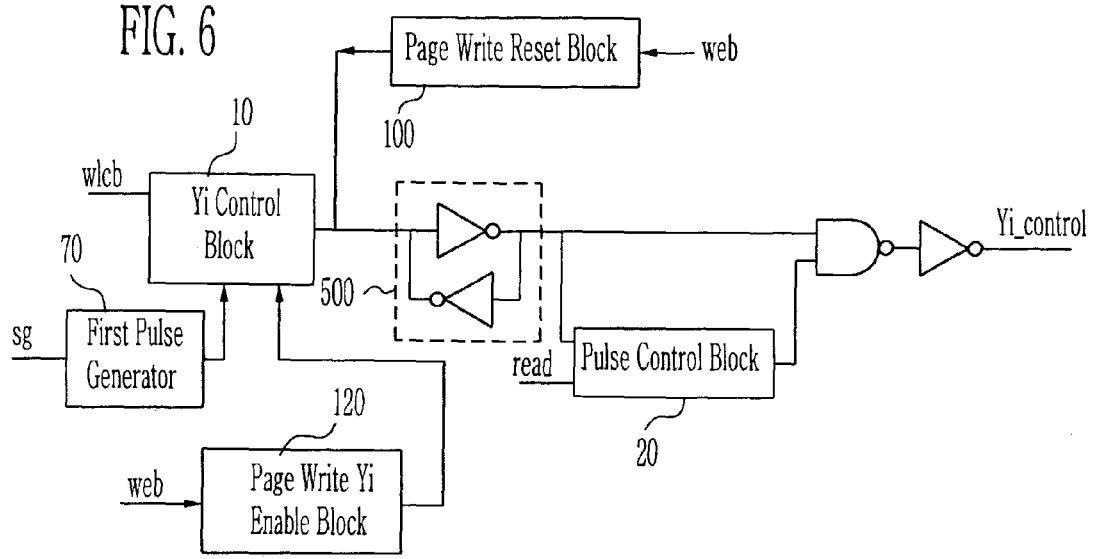
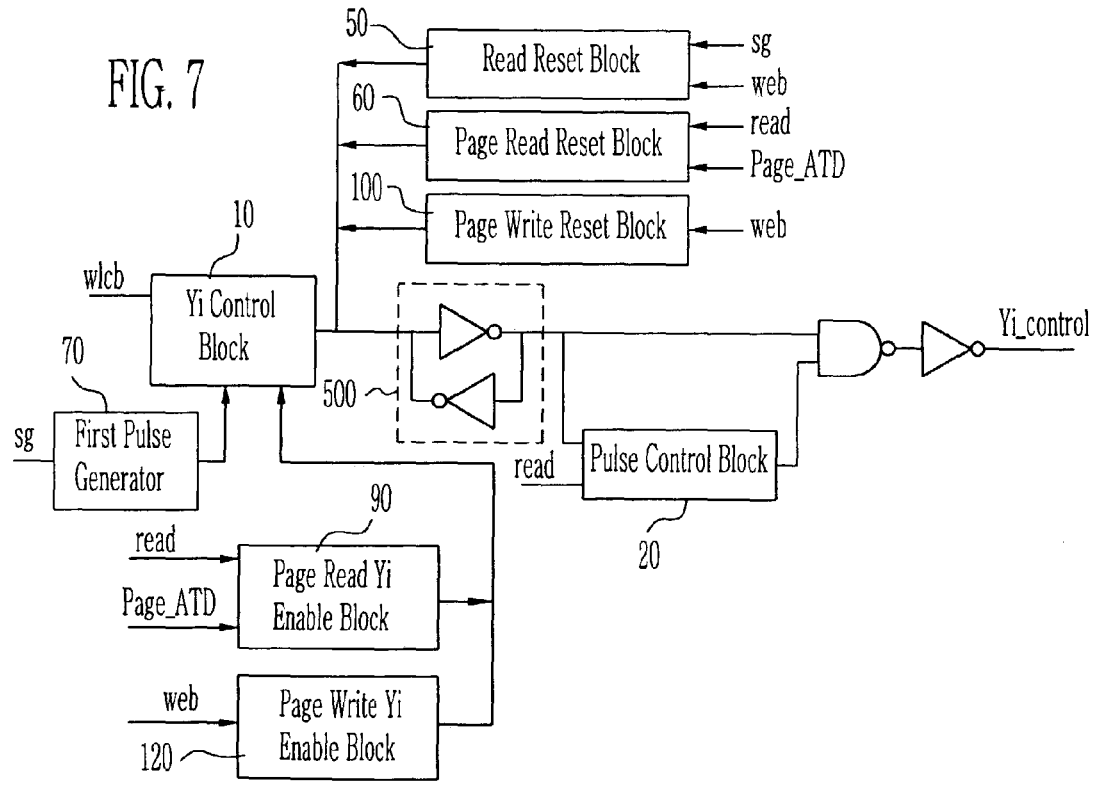

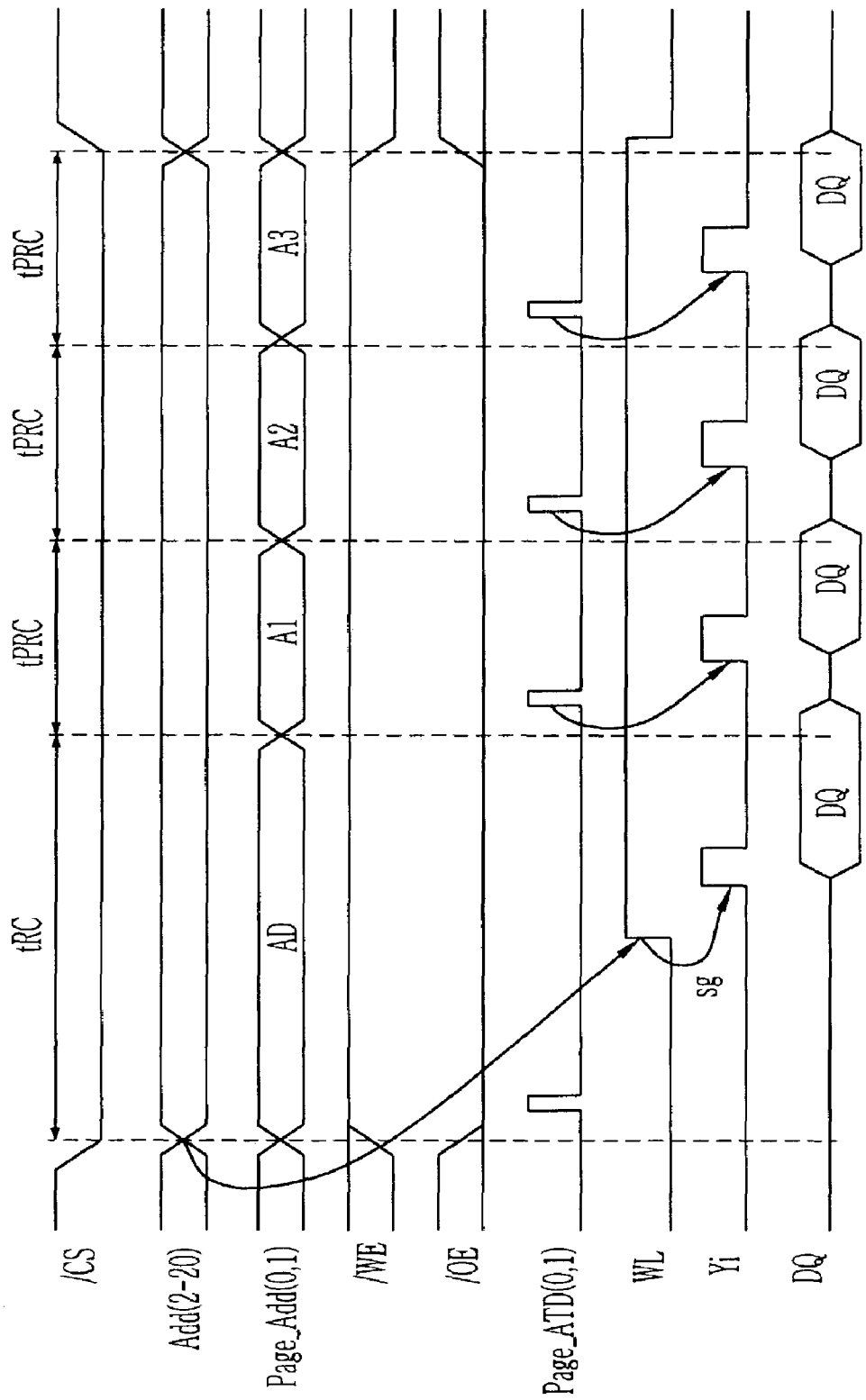

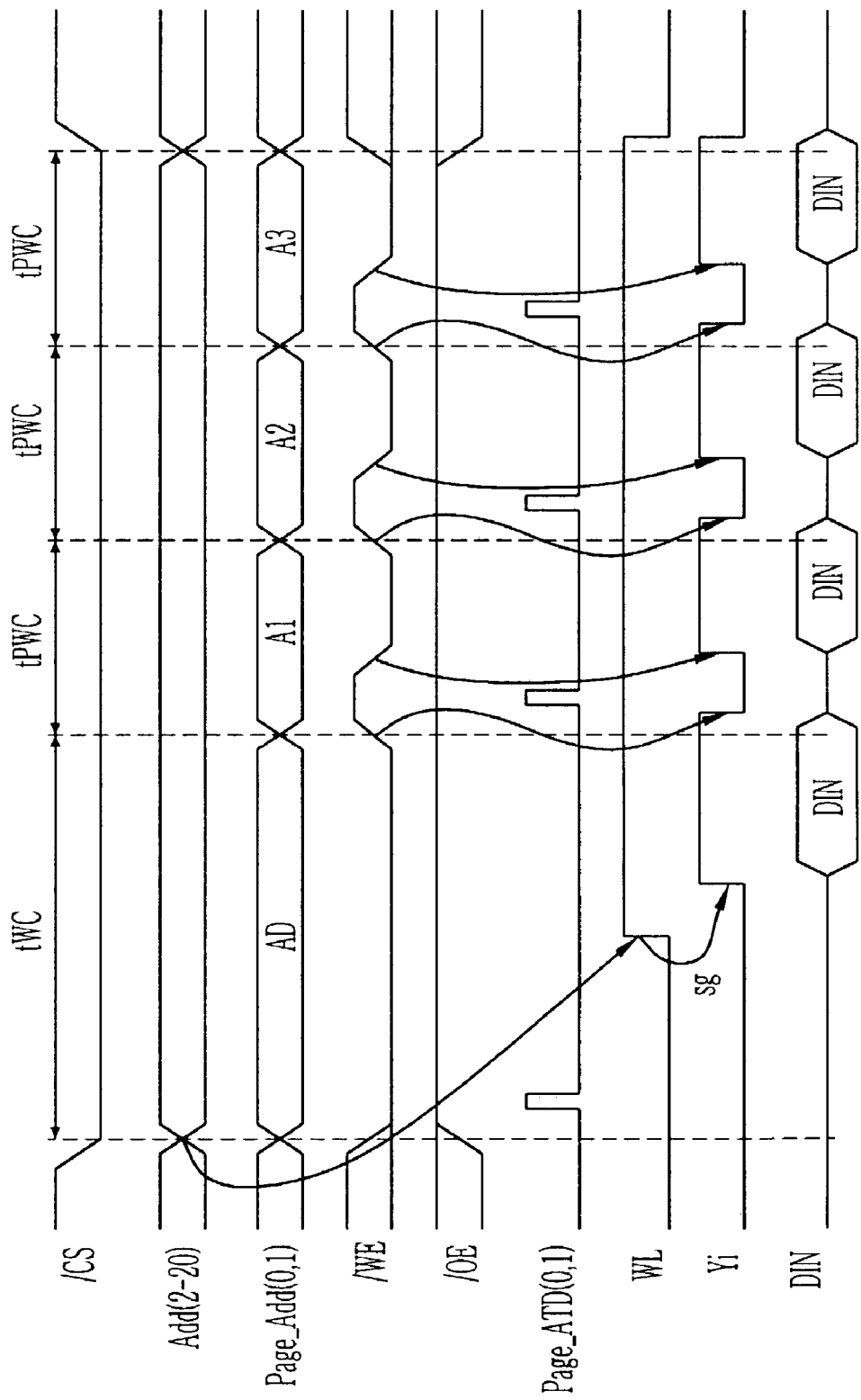

CIRCUIT FOR GENERATING COLUMN SELECTION CONTROL SIGNAL IN MEMORY DEVICE

BACKGROUND

1. Technical Field

A circuit for generating a column select (Yi) control signal in a memory device is disclosed. More particularly, a circuit for generating a column select (Yi) control signal in a memory device is disclosed that can be widely used in a memory device, etc. that performs a page mode in order to speed up a read/write speed, among the memory devices.

2. Description of the Related Art

There are several modes to speed up the read/write speed of data in memory devices.

Recently, among the memory devices that have been developed for a mobile phone, there is a memory device having the page read mode for improving the read speed. However, there is no memory device having the page write mode for improving the write speed. Thus, there is a need for a structure that can generate a Yi control signal that operates in the page write mode corresponding to the page read mode.

In the common memory device, a row address is used to select a specific word line of a plurality of word lines. If the word line is thus selected, data in the memory cell is charge-shared in the bit line. A bit line sense amplifier amplifies the narrow signal that was charge-shared to a level having a full swing width. This state is called an active state and this path is called a row path.

Further, a column address is used to select one of the plurality of the memory cells connected to the specific word line selected by the row address and to output data in the bit line to the outside. This path is called a column path. In general, when comparing the row path and the column path, the row path is longer. Lots of time is thus consumed in the row path.

Therefore, in order to perform more efficient read or write operations in the memory device, the concept of the page mode was developed. The page mode means the memory cells sharing the same word line. There are 4 words, 8 words, 16 words, a full page, and the like, depending on the length along which the page operation is performed by the memory cells sharing the same word line. As the memory cells share the same word line, the row address is same but the column address is different.

Therefore, the row path operation and the column path operation are not performed every time when data is stored at or written in the memory cells. Instead, the operation of the row path having the longer path is performed once when it is performed at the first time. Thus, only the column address is changed in a state that the word line is selected, so that the column path operation can be performed at high speed.

A conventional circuit for generating a column select (Yi) control signal operating in a normal operation mode will be described. FIG. 1a is the circuit diagram for generating the Yi control signal, which operates in the normal operation mode, FIG. 1b is a detailed circuit diagram of a Yi control block 10 shown in FIG. 1a, and FIG. 1c is a detailed circuit diagram of a pulse control block 20 shown in FIG. 1a.

The circuit for generating the Yi control signal operating in the normal operation mode includes the Yi control block 10 and the pulse control block 20. The Yi control block 10 logically combines a signal (wlcb) (word line clear bar) and a control signal (sg) (signal having the same path to the signal (wlcb) but having different time delayed by a delay unit 30) to generate the Yi control signal. The pulse control block 20 outputs the Yi control signal as a pulse if the read signal is HIGH or output the Yi control signal as a level if the read signal is LOW.

However, page modes are not available for the conventional circuit shown in FIG. 1. Thus, the conventional circuit shown in FIG. 1 cannot perform a page write mode.

SUMMARY OF THE DISCLOSURE

To solve the above problems, a circuit for generating a column select (Yi) control signal is disclosed that operates even in a page write mode corresponding to a page read mode.

In order to implement the page read mode, in a first cycle of the page read mode (first cycle means one when a page address and other addresses not the page address are simultaneously changed), the Yi control signal is controlled to be a pulse using a signal of a path such as a signal used to enable the word line. Also, in a case where only the page address is changed within the same page, a page ATD (address transition detection) signal is produced using a change of the page address. The Yi control signal is thus controlled to be a pulse using the page ATD signal. Thus, the column path operation can be performed at a high speed and within the same page.

Also, in order to implement the page write mode, in a first cycle of the page write (the first cycle is one when a page address and other addresses not the page address are simultaneously changed) similarly to the page read mode, the Yi control signal is controlled to be a level using a signal of a path such as a signal used to enable the word line. Also, in a case where only the page address is changed within the same page, the page ATD (address transition detection) signal is produced using change of the page address. The Yi control signal is thus controlled to be a level using the page ATD signal. Thus, the column path operation can be performed at a high speed and within the same page.

BRIEF DESCRIPTION OF THE DRAWINGS

The aforementioned aspects and other features of the disclosed circuits will be explained in the following description, taken in conjunction with the accompanying drawings, wherein:

FIG. 1b is a detailed circuit diagram of the column select (Yi) signal control block shown in FIG. 1a;

FIG. 1c is a detailed circuit diagram of a pulse control block shown in FIG. 1a;

FIG. 6 illustrates a circuit for generating the Yi control signal in the page write and normal operation modes according to a fifth preferred embodiment;

FIG. 7 illustrates a circuit for generating the Yi control signal in the page read, write and normal operation modes according to a fifth preferred embodiment;

FIG. 9 is a timing diagram of a page read mode; and

FIG. 10 is timing diagram of a page write mode.

DETAILED DESCRIPTION OF THE PRESENTLY PREFERRED EMBODIMENTS

Figure 2:
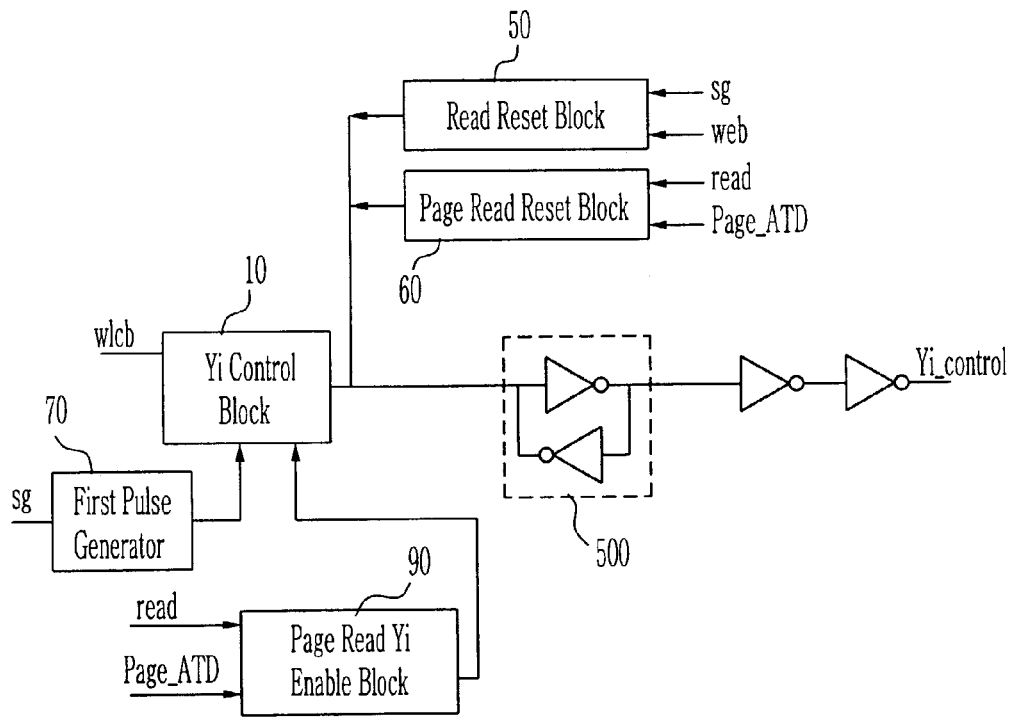
FIG. 2 illustrates a circuit for generating a Yi control signal in a page read mode according to a first preferred embodiment.
Figure 8A:
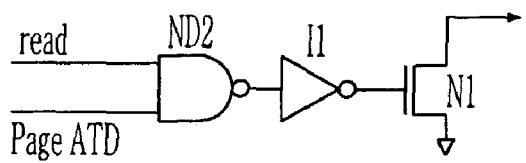
FIG. 8a is a detailed circuit diagram of a page read Yi enable block.
Figure 8B:
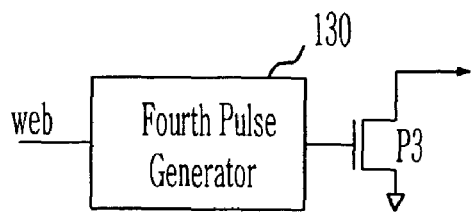
FIG. 8b is a detailed circuit diagram of a page write Yi enable block.
Figure 8C:
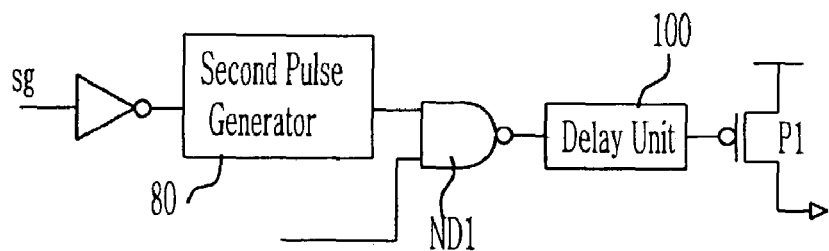
FIG. 8c is a detailed circuit diagram of a read reset block.
Figure 8D:
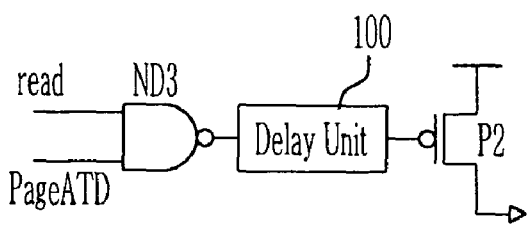
FIG. 8d is a detailed circuit diagram of a page read reset block.
Figure 8E:
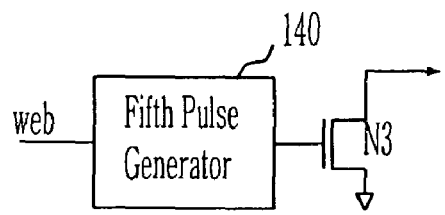
FIG. 8e is a detailed circuit diagram of a page write reset block.

FIG. 2 shows a circuit for generating a column select (Yi) control signal in a page read mode according to the present invention. FIG. 8a is a detailed circuit diagram of a page read Yi enable block, FIG. 8b is a detailed circuit diagram of a page write Yi enable block, FIG. 8c is a detailed circuit diagram of a read reset block, FIG. 8d is a detailed circuit diagram of a page read reset block and FIG. 8e is a detailed circuit diagram of a page write reset block.

The circuit for generating the Yi control signal will be now described by reference to FIG. 2 and FIG. 8a to FIG. 8e.

Figure 1A:
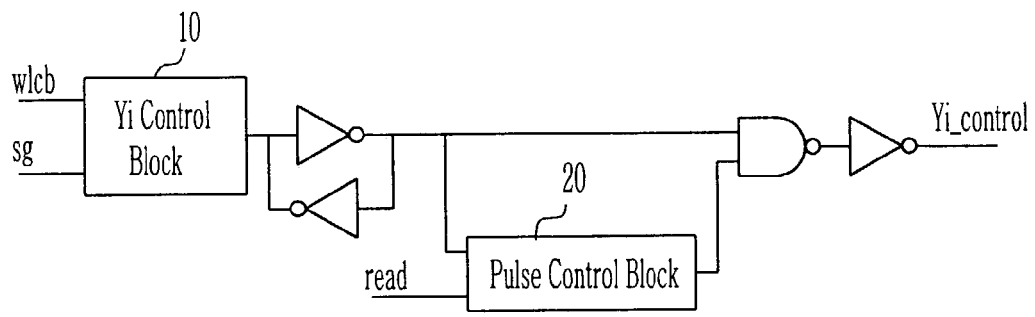
FIG. 1a is a conventional circuit diagram for generating a Yi control signal in a normal operation mode.
Figure 1B:
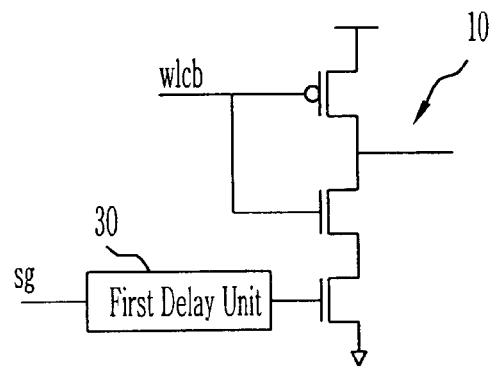
Figure 1C:
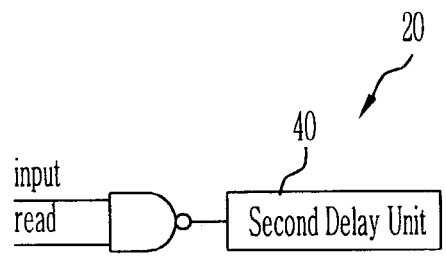

Referring to FIG. 2, in a first cycle of a page read mode (the first cycle is one when a page address and other addresses not the page address are simultaneously changed), a Yi control block 10 such as one shown in FIG. 1a combines a signal (wlcb) (word line clear bar) and a control signal (sg) (signal having the same path to the signal (wlcb) but having different time delay) to generate the Yi control signal. At this time, in the conventional circuit, the level signal (sg) is directly inputted to the Yi control block 10. However, in the disclosed circuit, the control signal (sg) is inputted to the control block 10 through a first pulse generator 70. The first pulse generator 70 is used to produce HIGHI pulses when the signal (sg) is shifted from LOW to HIGH, in order to again reset a latch 500 since only the column path must be consecutively performed in a state that the word line selected.

Further, the circuit further includes a read reset block 50 for resetting the latch 500 that was set by the control block 10. A detailed construction of the read reset block 50 is shown in FIG. 8c. The read reset block 50 includes a second pulse generator 80 for generating a HIGH pulse when the level signal (sg) is shifted from LOW to HIGH, a NAND gate ND1 for logically combines the HIGH pulse from the second pulse generator 80 and a signal (web) (write enable bar), and a delay unit 100 for delaying an output signal from the NAND gate ND1. At this time, the NAND gate ND1 serves to shut down the reset signal when the signal (web) is LOW (write mode) and to generate the reset signal only when the signal (web) is HIGH. Also, a PMOS transistor P1 is turned or off by the output signal of the delay unit 100, so that the reset signal is generated.

Further, the page read Yi enable block 90 combines a signal (read) (signal informing the read mode) and a signal (Page ATD) (address transition detection) (signal informing that the page address is changed) when the first cycle of the page read mode is finished and only the page address is then changed within the same page, to generate the Yi control signal, as shown in FIG. 8a. In FIG. 8a, signal read and Page ATD are combined by a NAND gate ND2. An output of the NAND gate ND2 is inverted by an inverter I1 and a NMOS transistor N1 is turned on according to an output of the inverter I1. Also, in order to reset the latch 500 set by the enable block 90, a page read reset block 60 is used. As shown in FIG. 8d, the page read reset block 60 combines the signal (read) and the signal (Page ATD) to output the combined signal to the delay unit 100. In FIG. 8d, the signals read and Page ATD are combined by a NAND gate ND3. An output of the NAND gate ND3 is transferred to a PMOS transistor P2 via a delay unit 100. The PMOS transistor P2 is turned on in response to an output of the delay circuit 100.

FIG. 9 is a timing diagram of the page read mode that is consecutively performed by the circuit shown in FIG. 2. As the row path operation and the column path operation are simultaneously performed in the first cycle of the page mode, the read cycle time (tRC) is required. In a subsequent cycle, only the page read cycle time (tPRC) is necessary to perform the column path operation.

Figure 3:
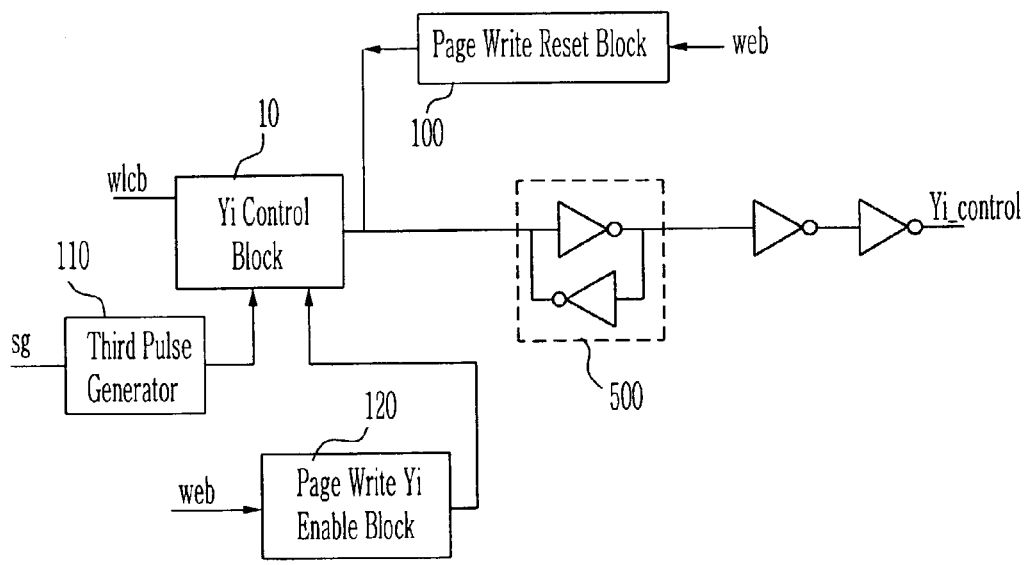
FIG. 3 illustrates a circuit for generating the Yi control signal in a page write mode according to a second preferred embodiment.

FIG. 3 shows a circuit for generating the Yi control signal in the page write mode. At the first cycle of the page write mode (the first cycle is one when a page address and other addresses not the page address are simultaneously changed), a Yi control block 10 combines a signal (wlcb) (word line clear bar) and a signal (sg) (signal being the same page signal to the word line clear bar signal (wlcb) but having different timing delay) to generate a Yi control signal, as shown in FIG. 1a. At this time, in the conventional circuit, the signal (sg) is the level signal is directly inputted to the control block 10. However, in the disclosed circuit, the control signal (sg) is inputted to the control block 10 through a third pulse generator 110. The third pulse generator 110 is used to produce HIGH pulses when the signal (sg) is shifted from LOW to HIGH, in order to again reset the latch 500 since only the column path must be consecutively performed in a state that the word line selected.

Also, the circuit includes a page write Yi enable block 120. A detailed construction of the enable block 120 is shown in FIG. 8b. In FIG. 8b, a fourth pulse generator 130 is operated in response to the signal (web) and a PMOS transistor P3 is turned on in response to an output thereof. The enable block 120 serves to control the signal (web) by a given time when only the page address is changed within the same page after the first cycle of the page write mode is finished as shown in FIG. 10. A fourth pulse generator 130 generates a HIGH pulse when the signal (web) from the enable block 120 is shifted from HIGH to LOW, to output the Yi control signal. In order to reset the latch 500 set in the enable block 120, a page write reset block 100 is used. A detailed construction of the page write reset block 100 is shown in FIG. 8e. As shown in FIG. 8e, the page write reset block 100 includes a fifth pulse generator 140 for generating LOW pulses when the signal (web) is shifted from LOW to HIGH. A NMOS transistor N3 is turned on in response to an output of the fifth pulse generator FIG. 10 is a timing diagram of the page write mode that is consecutively performed by the circuit shown in FIG. 3. As the row path operation and the column path operation are simultaneously performed in the first cycle of the page mode, time of tWC (write cycle time) is required. In a subsequent cycle, the page write cycle time (tPWC) is necessary to perform the column path operation.

Figure 4:
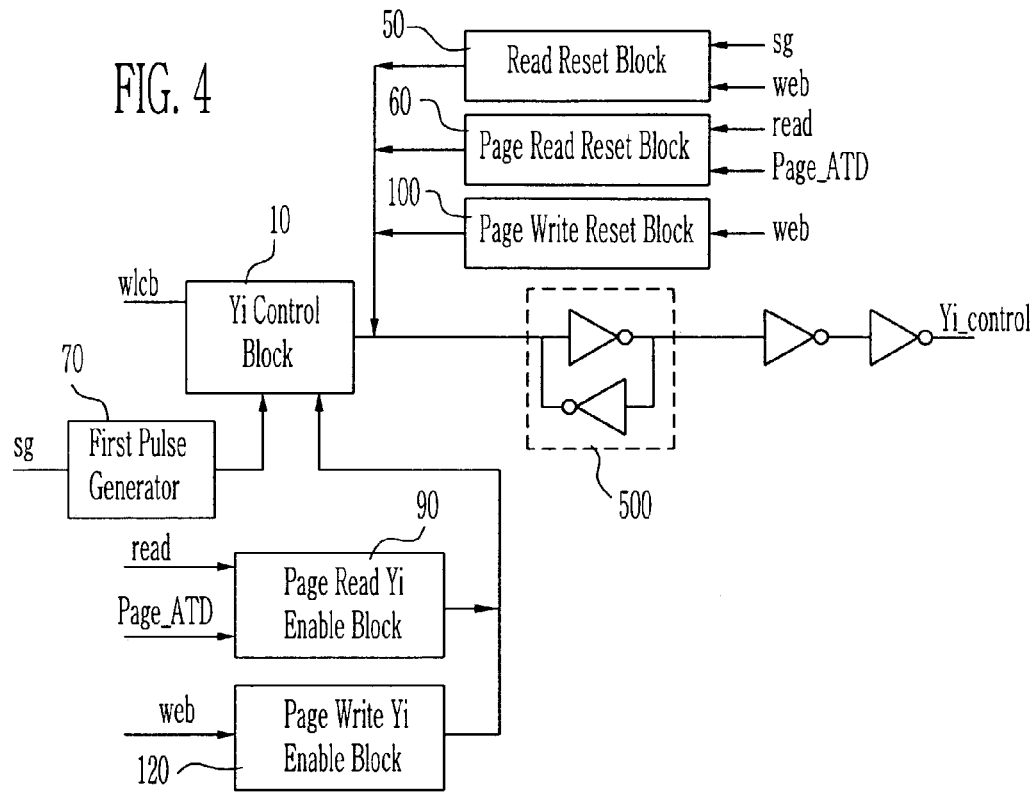
FIG. 4 illustrates a circuit for generating the Yi control signal in the page read and write modes according to a third preferred embodiment.

FIG. 4 shows a circuit for generating the Yi control signal that is simultaneously driven both in the page read and page write modes. This circuit includes a Yi control block 10, a read reset block 50, a page read Yi enable block 90, a page read reset block 60, a page write Yi enable block 120 and a page write reset block 100, all of which perform the same functions as those described in FIG. 2 and FIG. 3. A detailed explanation of them will be thus omitted. This circuit can be used in the memory device that simultaneously performs the page read mode and the page write mode.

Figure 5:
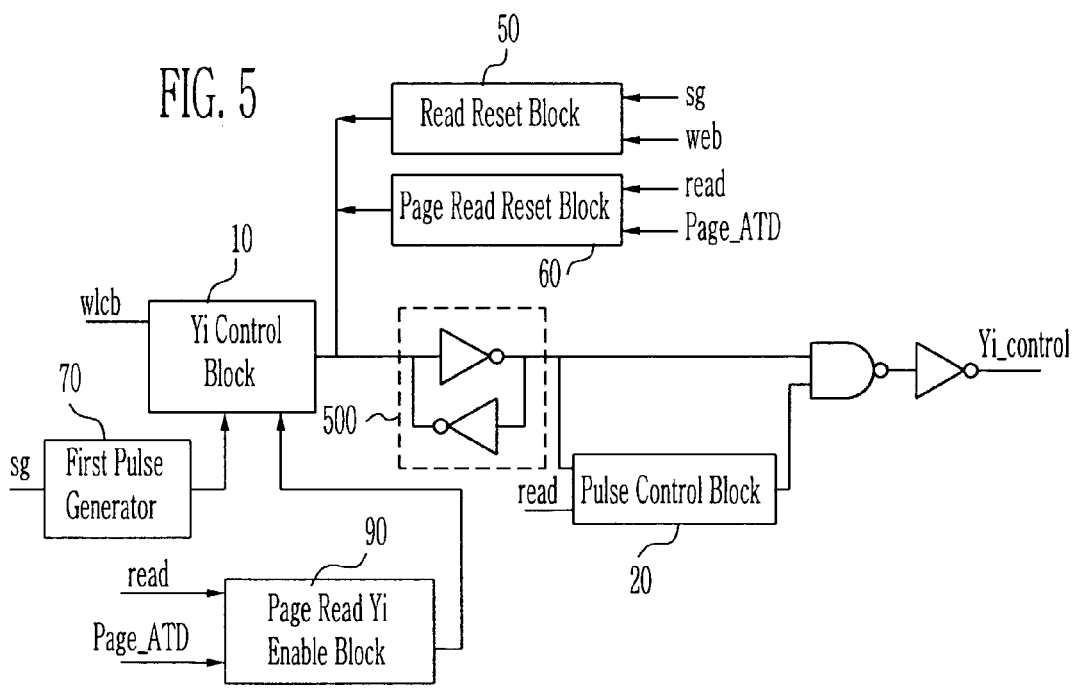
FIG. 5 illustrates a circuit for generating the Yi control signal in the page read and normal operation modes according to a fourth preferred embodiment.

FIG. 5 shows a circuit for generating the Yi control signal that can be used in the memory device that supports both the page read and normal operation modes. The circuit includes a Yi control block 10, a read reset block 50, a page read Yi enable block 90, a page read reset block 60, and the like, all of which perform the same functions to those described in FIG. 2. A detailed explanation of them will be thus omitted. This circuit block is driven in the page read mode. The circuit further includes a pulse control block 20. The pulse control block 20 serve to produce the Yi control signal as a pulse upon the read operation, and produce the Yi control signal as a level upon the write operation, in the normal operation mode. In the page read operation, this circuit performs the same function as that described in FIG. 2.

FIG. 6 shows a circuit for generating the Yi control signal that can be used in the memory device that supports both the page write and normal operation modes. The circuit includes a Yi control block 10, a page write Yi enable block 120, a page write reset block 100, and the like, all of which perform the same functions to those described in FIG. 3. This circuit is driven in the page write mode. This circuit further includes a pulse control block 20. The pulse control block 20 serves to produce the Yi control signal as a pulse upon the read operation and produce the Yi control signal as a level upon the write operation, in the normal operation mode. In the page write mode, this circuit performs the same function to that described in FIG. 3.

FIG. 7 is a circuit for generating the Yi control signal that is used in the page read mode, the page write mode and the normal operation mode. This circuit includes a Yi control block 10, a read reset block 50, a page read Yi enable block 90, a page read reset block 60, a page write Yi enable block 120, a page write reset block 100, and the like, all of which perform the same functions as those described in FIG. 2 and FIG. 3. A detailed explanation of them will be thus omitted. This circuit block is driven in the page read mode and the page write mode. This circuit further includes a pulse control block 20. The pulse control block 20 serves to produce the Yi control signal as a pulse upon the read operation and produce the Yi control signal as a level upon the write operation, in the normal operation mode. In the page read mode and the page write mode, this circuit performs the same function to that described in FIG. 2 and FIG. 3.

As mentioned above, the disclosed circuit can implement a memory device that operates in a page read mode and a page write mode.

The disclosed circuits have been described with reference to certain particular embodiments in connection with particular applications. Those having ordinary skill in the art and access to the teachings of this disclosure will recognize additional modifications and applications within the scope thereof.

It is therefore intended by the appended claims to cover any and all such applications, modifications, and embodiments within the scope of this disclosure.

What is claimed is:

1. A circuit for generating a column select (Yi) control signal in a memory device, the circuit comprising:
    a Yi control block for generating a Yi control signal for a first cycle of a page mode;
    a page read Yi enable block for generating the Yi control signal when a page address is changed in a page read mode;
    a latch for setting the Yi control signal from at least the Yi control block or the page read Yi enable block;
    a read reset block for resetting the latch set by the Yi control block; and
    a page read reset block for resetting the latch set by the page read Yi enable block.

2. The circuit as claimed in claim 1, wherein the read reset block combines a signal generated when a first control signal is shifted from HIGH to LOW and a write enable bar signal to generate a reset signal.

3. The circuit as claimed in claim 1, wherein the page read Yi enable block combines a signal informing the page read and a page address transition detection signal generated when a page address is changed, to generate the Yi control signal.

4. The circuit as claimed in claim 1, wherein the page read reset block delays a signal generated by combination of a signal informing the read mode and an address transition detection signal generated when a page address is changed, to generate a page reset signal.

5. A circuit for generating a column select (Yi) control signal in a memory device, comprising:
    a Yi control block for generating a Yi control signal for a first cycle of a page mode;
    a page write Yi enable block for generating the Yi control signal when a write enable bar signal is enabled in a page write mode;
    a latch for latching the Yi control signal from at least the Yi control block or the page write Yi enable block; and
    a page write reset block for resetting the latch set by the page write Yi enable block.

6. The circuit as claimed in claim 5, wherein the page write reset block generates a reset signal depending on an output of a pulse generator for generating a LOW pulse when the write enable bar signal is shifted from LOW to HIGH.

7. A circuit for generating a column select (Yi) control signal in a memory device, comprising:
    a Yi control block for generating a Yi control signal for a first cycle of a page mode;
    a read reset block for resetting a latch set with the Yi control signal from the Yi control block;
    a page read Yi enable block for generating the Yi control signal when a page address is changed in a page read mode;
    a page read reset block for resetting the latch set with the Yi control signal from the page read Yi enable block;
    a page write Yi enable block for generating the Yi control signal when a write enable bar signal is enabled in a page write mode; and
    a page write reset block for resetting the latch set with the Yi control signal from the page write Yi enable block.

8. The circuit as claimed in claim 7, wherein the Yi control block generates the Yi control signal depending on an output of a pulse generator for generating a HIGH pulse when a word line clear bar signal and a first control signal are shifted from LOW to HIGH.

9. The circuit as claimed in claim 7, wherein the page write Yi enable block generates the Yi control signal depending on an output of a pulse generator for generating a HIGH pulse when the write enable bar signal is shifted from HIGH to LOW.

10. A circuit for generating a column select (Yi) control signal in a memory device, comprising:
- a Yi control block for generating a Yi control signal for a first cycle of a page mode;
- a read reset block for resetting a latch set with the Yi control signal from the Yi control block;
- a page read Yi enable block for generating a Yi control signal when a page address is changed in a page read mode;
- a page read reset block for resetting the latch set with the Yi control signal from the page read Yi enable block; and
- a pulse control block for controlling the Yi control signal in a normal operation mode.

11. A circuit for generating a column select (Yi) control signal in a memory device, comprising:
- a Yi control block for generating a Yi control signal for a first cycle of a page mode;
- a page write Yi enable block for generating the Yi control signal when a write enable bar signal is enabled in a page write mode;
- a page write reset block for resetting a latch set with the Yi control signal from the page write Yi enable block in the page write mode; and
- a pulse control block for controlling the Yi control signal in a normal operation mode.

12. A circuit for generating a column select (Yi) control signal in a memory device, comprising:
- a Yi control block for generating a Yi control signal for a first cycle of a page mode;
- a read reset block for resetting a latch set with the Yi control signal from the Yi control block;
- a page read Yi enable block for generating the Yi control signal when a page address is changed in a page read mode;
- a page read reset block for resetting the latch set with the Yi control signal from the page read Yi enable block;
- a page write Yi control signal block for generating the Yi control signal when a write enable bar signal is enabled in the page write mode; and
- a page write reset block for resetting the latch set with the Yi control signal from the page write Yi enable block; and
- a pulse control block for controlling the Yi control signal in a normal operation mode.

13. A circuit for generating a column select (Yi) control signal in a memory device, the circuit comprising:
- a Yi control block to generate a Yi control signal during a first cycle of a page mode;
- a page read Yi enable block to generate the Yi control signal during cycles of a page read mode subsequent to a first cycle of the page read mode;
- a latch to set the Yi control signal from at least the Yi control block or the page read Yi enable block;
- a read reset block to reset the latch in the first cycle of the page read mode; and
- a page read reset block to reset the latch during the cycles of the page read mode subsequent to the first cycle of the page read mode.

14. A circuit for generating a column select (Yi) control signal in a memory device, the circuit comprising:
- a Yi control block to generate a Yi control signal during a first cycle of a page mode;
- a page write Yi enable block to generate the Yi control signal during cycles of a page write mode subsequent to a first cycle of the page write mode;
- a latch to set the Yi control signal from at least the Yi control block or the page write Yi enable block; and
- a page write reset block to reset the latch during the cycles of the page write mode subsequent to the first cycle of the page write mode.

15. A circuit for generating a column select (Yi) control signal in a memory device, the circuit comprising:
- a Yi control block to generate a Yi control signal during a first cycle of a page mode;
- a page read Yi enable block to generate the Yi control signal during cycles of a page read mode subsequent to a first cycle of the page read mode;
- a page write Yi enable block to generate the Yi control signal during cycles of a page write mode subsequent to a first cycle of the page write mode;
- a latch to set the Yi control signal from at least the Yi control block, the page read Yi enable block, or the page write Yi enable block;
- a read reset block to reset the latch in the first cycle of the page read mode;
- a page read reset block to reset the latch during the cycles of the page read mode subsequent to the first cycle of the page read mode; and
- a page write reset block to reset the latch during the cycles of the page write mode subsequent to the first cycle of the page write mode.

* * * * *